United States Patent
Hirata

(10) Patent No.: US 10,774,445 B2
(45) Date of Patent: Sep. 15, 2020

(54) WAFER PRODUCTION METHOD

(71) Applicant: DISCO CORPORATION, Tokyo (JP)

(72) Inventor: Kazuya Hirata, Tokyo (JP)

(73) Assignee: DISCO CORPROATION, Tokyo (JP)

( * ) Notice: Subject to any disclaimer, the term of this patent is extended or adjusted under 35 U.S.C. 154(b) by 656 days.

(21) Appl. No.: 15/397,309

(22) Filed: Jan. 3, 2017

(65) Prior Publication Data

US 2017/0198411 A1    Jul. 13, 2017

(30) Foreign Application Priority Data

Jan. 7, 2016    (JP) .................... 2016-001647

(51) Int. Cl.
| | |
|---|---|
| *C30B 33/04* | (2006.01) |
| *C30B 29/30* | (2006.01) |
| *B23K 26/53* | (2014.01) |
| *C30B 33/06* | (2006.01) |

(52) U.S. Cl.
CPC .............. *C30B 33/04* (2013.01); *B23K 26/53* (2015.10); *C30B 29/30* (2013.01); *C30B 33/06* (2013.01)

(58) Field of Classification Search
CPC .... C30B 29/30; C30B 33/04; H03H 9/02031; H03H 9/02543; H03H 9/02559
See application file for complete search history.

(56) References Cited

U.S. PATENT DOCUMENTS

| | | | | | |
|---|---|---|---|---|---|
| 4,196,963 | A | * | 4/1980 | Chen ..................... | C01G 33/00 385/130 |
| 4,224,548 | A | * | 9/1980 | O'Connell ............. | G10K 11/36 310/1 |
| 4,583,019 | A | * | 4/1986 | Yamada ............. | H03H 9/02031 310/318 |
| 5,209,917 | A | * | 5/1993 | Ohno ..................... | C30B 19/02 117/56 |
| 5,315,432 | A | * | 5/1994 | Ohno ..................... | C30B 19/02 359/326 |
| 5,359,452 | A | * | 10/1994 | Nitanda .................. | C30B 11/00 359/328 |
| 6,211,999 | B1 | * | 4/2001 | Gopalan ................. | C30B 33/00 359/326 |
| 6,897,126 | B2 | * | 5/2005 | Asano ................. | H01L 21/3043 257/E21.238 |

(Continued)

FOREIGN PATENT DOCUMENTS

JP    2000-094221    4/2000

*Primary Examiner* — Matthew J Daniels
*Assistant Examiner* — Andrew D Graham
(74) *Attorney, Agent, or Firm* — Green Burns & Crain Ltd.

(57) ABSTRACT

A wafer production method for producing a wafer from a lithium tantalate ingot includes a step of irradiating, from an end face of a lithium tantalate ingot which is a 42-degree rotation Y cut ingot having an orientation flat formed in parallel to a Y axis, a laser beam of a wavelength having transparency to lithium tantalate with a focal point of the laser beam positioned in the inside of the ingot to form a modified layer in the inside of the ingot while the ingot is fed for processing, and a step of applying external force to the ingot to peel off a plate-shaped material from the ingot to produce a wafer. At the step of forming a modified layer, the ingot is relatively fed for processing in a direction parallel or perpendicular to the orientation flat.

13 Claims, 6 Drawing Sheets

(56) References Cited

U.S. PATENT DOCUMENTS

| | | | | |
|---|---|---|---|---|
| 7,070,702 | B1* | 7/2006 | Eason | C30B 33/00 |
| | | | | 216/87 |
| 7,364,986 | B2* | 4/2008 | Nagai | B23K 26/08 |
| | | | | 438/463 |
| 8,035,464 | B1* | 10/2011 | Abbott | H03H 9/02559 |
| | | | | 333/193 |
| 8,389,099 | B1* | 3/2013 | Matthews | H01L 23/544 |
| | | | | 148/33.2 |
| 2003/0003608 | A1* | 1/2003 | Arikado | H01L 23/544 |
| | | | | 438/14 |
| 2003/0060020 | A1* | 3/2003 | Walitzki | B24B 1/005 |
| | | | | 438/455 |
| 2004/0089958 | A1* | 5/2004 | Arai | H01L 23/544 |
| | | | | 257/797 |
| 2004/0104361 | A1* | 6/2004 | Guldi | H01L 21/67282 |
| | | | | 250/559.36 |
| 2004/0232803 | A1* | 11/2004 | Matsushita | C30B 29/30 |
| | | | | 310/358 |
| 2006/0118920 | A1* | 6/2006 | Subramanian | H01L 21/30617 |
| | | | | 257/627 |
| 2007/0216261 | A1* | 9/2007 | Higuchi | H01L 41/187 |
| | | | | 310/358 |
| 2008/0280424 | A1* | 11/2008 | Yamazaki | H01L 27/1266 |
| | | | | 438/480 |
| 2010/0126489 | A1* | 5/2010 | Bakshi | B08B 3/02 |
| | | | | 125/16.02 |
| 2013/0161794 | A1* | 6/2013 | Aida | C30B 33/04 |
| | | | | 257/615 |
| 2014/0001917 | A1* | 1/2014 | Yamashita | H01L 41/08 |
| | | | | 310/313 A |
| 2014/0125431 | A1* | 5/2014 | Bhattacharjee | H03H 9/02275 |
| | | | | 333/186 |
| 2015/0009499 | A1* | 1/2015 | Lin | H01L 21/268 |
| | | | | 356/401 |
| 2017/0054068 | A1* | 2/2017 | Masayuki | H01L 41/1873 |
| 2017/0063326 | A1* | 3/2017 | Kapusta | H03H 3/08 |
| 2017/0117158 | A1* | 4/2017 | Dechamp | H01L 21/304 |
| 2017/0170385 | A1* | 6/2017 | Nagae | H01L 41/313 |
| 2017/0301592 | A1* | 10/2017 | Takeda | H01L 21/78 |
| 2018/0006629 | A1* | 1/2018 | Tanno | H03H 3/08 |
| 2018/0048283 | A1* | 2/2018 | Tanno | H01L 41/18 |
| 2018/0080144 | A1* | 3/2018 | Tanno | C04B 37/00 |
| 2018/0175826 | A1* | 6/2018 | Sadhu | H03H 9/568 |
| 2018/0294793 | A1* | 10/2018 | Tanno | H03H 9/25 |
| 2018/0375014 | A1* | 12/2018 | Ghyselen | C30B 25/186 |
| 2019/0044494 | A1* | 2/2019 | Abatake | B23K 26/57 |

* cited by examiner

WAFER PRODUCTION METHOD

BACKGROUND OF THE INVENTION

Field of the Invention

The present invention relates to a wafer production method for efficiently producing a wafer from a lithium tantalate ingot.

Description of the Related Art

A surface acoustic wave (SAW) device is formed such that a function layer is stacked on the surface of a wafer made of lithium tantalate ($LiTaO_3$) as a material and is partitioned by division lines. Then, processing is performed along the division lines of the wafer by a cutting apparatus or a laser processing apparatus such that the wafer is divided into individual SAW devices. The SAW devices are used in a high frequency filter and so forth adopted in mobile communication equipment such as a portable telephone set, a personal computer or video media equipment.

Further, it is known that a wafer on which devices are to be formed is produced generally by slicing an ingot using a wire saw and the front and rear faces of the sliced wafer are polished to finish the faces each into a mirror face (for example, refer to Japanese Patent Laid-Open No. 2000-094221).

SUMMARY OF THE INVENTION

Where an ingot is cut by a wire saw and polished at the front and rear faces thereof to produce a wafer, there are problems that it is not easy to make the wafer to be produced thin in order to achieve reduction in thickness and weight of devices, and that, if it is intended to reduce the thickness of a wafer to be produced as far as possible, then the ratio of the ingot scraped off upon cutting and polishing increases, which is uneconomical.

Especially, a lithium tantalate ingot is high in Mohs hardness, and there is a problem that cutting of a lithium tantalate ingot by a wire saw requires considerable time and is low in productivity. Further, since an ingot having a high unit price is scraped off and wastefully discarded upon processing, it is demanded to develop a method of producing a thin wafer by efficiently cutting a lithium tantalate ingot without wasting the lithium tantalate ingot.

Therefore, the object of the present invention is to provide a production method of a wafer by which a wafer can be efficiently produced from a lithium tantalate ingot and the amount of the ingot to be discarded can be reduced.

In accordance with an aspect of the present invention, there is provided a wafer production method for producing a wafer from a lithium tantalate ingot which is a 42-degree rotation Y cut ingot having an end face extending perpendicularly with respect to a center axis set with a rotational angle of 42 degrees with respect to a Y axis orthogonal to a crystal axis of a lithium tantalite and having an orientation flat formed in parallel to the Y axis, comprising: a modified layer formation step of irradiating a laser beam of a wavelength having transparency to lithium tantalate with a focal point of the laser beam positioned at a depth corresponding to a thickness of a wafer to be produced from the end face of the lithium tantalate ingot to form a modified layer in the inside of the lithium tantalate ingot while the lithium tantalate ingot is fed for processing relative to the laser beam; and a wafer production step of applying, after the modified layer formation step is carried out, external force to the lithium tantalate ingot to peel off a plate-shaped material from the lithium tantalate ingot to produce a wafer, wherein, when a modified layer is formed in the inside of the lithium tantalate ingot at the modified layer formation step, the lithium tantalate ingot is relatively fed for processing with respect to the laser beam in a direction parallel or perpendicular to the orientation flat.

Preferably, the wafer production method further includes a grinding step of grinding a peeling face of the produced wafer and a peeling face of the lithium tantalate ingot to flatten the peeling faces.

With the present invention, when a modified layer is to be formed at the modified layer formation step, a laser beam is relatively fed for processing in a parallel direction or an orthogonal (vertical) direction with respect to the orientation flat. Therefore, the cleavage direction exists in a transverse direction with respect to the direction in which the modified layer is formed. Consequently, a crack grows in parallel to the end face of the lithium tantalate ingot, and a wafer can be peeled off readily from the lithium tantalate ingot. Accordingly, a wafer can be produced efficiently from a lithium tantalate ingot and the amount of the lithium tantalate ingot to be discarded can be reduced.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
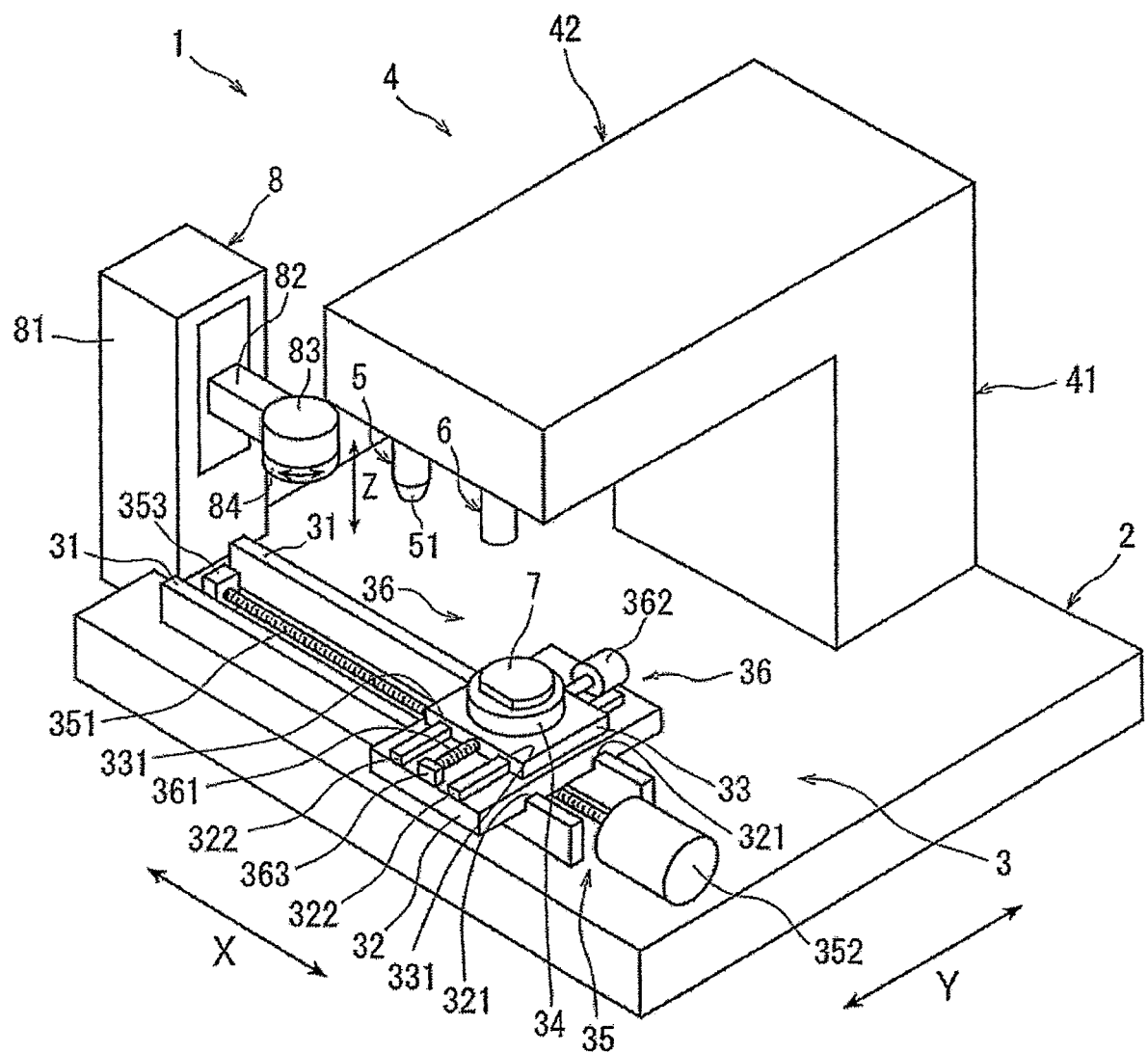
FIG. 1 is a perspective view of an entire laser processing apparatus.

In the following, a preferred embodiment of a production method of a wafer of lithium tantalate in accordance with the present invention is described with reference to the accompanying drawings. FIG. 1 depicts a perspective view of a laser processing apparatus 1 for carrying out the production method of a wafer of lithium tantalate in accordance with the present invention. The laser processing apparatus 1 depicted in FIG. 1 includes a stationary base 2, a holding table mechanism 3 for holding a workpiece disposed for movement in an X-axis direction indicated by an arrow mark X on the stationary base 2, and a laser beam irradiation unit 4 as laser beam irradiation means disposed on the stationary base 2.

Figure 2:
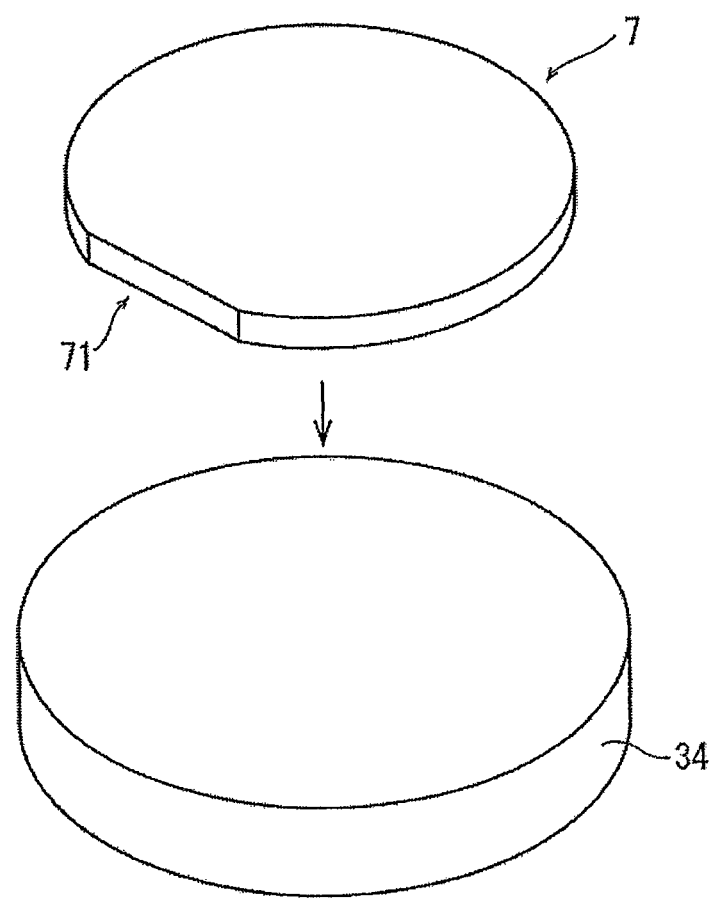
FIG. 2 is a perspective view illustrating a state in which a lithium tantalate ingot as a workpiece is mounted on a holding table of the laser processing apparatus depicted in FIG. 1.

The holding table mechanism 3 includes a pair of guide rails 31 disposed in parallel to each other along an X-axis direction on the stationary base 2, a first sliding block 32 disposed for movement in the X-axis direction on the guide rails 31, a second sliding block 33 disposed for movement in a Y-axis direction indicated by an arrow mark Y orthogonal to the X-axis direction on the first sliding block 32, and a holding table 34 formed in a cylindrical shape on the second sliding block 33 and including a pulse motor provided therein such that the holding table 34 can be rotated. In the laser processing apparatus 1 depicted in FIG. 1, a lithium tantalate ingot 7 which is a workpiece depicted in FIG. 2 is placed on the holding table 34.

The first sliding block 32 has a pair of guide grooves 321 provided on a lower face thereof for fitting with the pair of guide rails 31 and has a pair of guide rails 322 formed on an upper face thereof in parallel to each other along the Y-axis direction. The first sliding block 32 configured in this manner is configured for movement in the X-axis direction along the pair of guide rails 31 with the guide grooves 321 thereof fitted with the pair of guide rails 31. The holding table mechanism 3 includes X-axis direction movement means 35 for moving the first sliding block 32 in the X-axis direction along the pair of guide rails 31. The X-axis direction movement means 35 includes a male thread rod 351 disposed in parallel to and between the pair of guide rails 31 and a driving source such as a pulse motor 352 for driving the male thread rod 351 to rotate. The male thread rod 351 is supported at one end thereof for rotation on a bearing block 353 fixed to the stationary base 2 and is coupled at the other end thereof for motion transmission to an output power shaft of the pulse motor 352. It is to be noted that the male thread rod 351 is screwed in a female thread through-hole formed in a female screw block not depicted provided in a projecting manner on a lower face of a central portion of the first sliding block 32. Accordingly, if the male thread rod 351 is driven to rotate forwardly and reversely by the pulse motor 352, then the first sliding block 32 is moved in the X-axis direction along the pair of guide rails 31.

The second sliding block 33 has a pair of guide grooves 331 provided on a lower face thereof for fitting with the pair of guide rails 322 provided on the upper face of the first sliding block 32 and is configured for movement in the Y-axis direction with the guide grooves 331 fitted with the pair of guide rails 322. The holding table mechanism 3 includes Y-axis direction movement means 36 for moving the second sliding block 33 along the pair of guide rails 322 provided on the first sliding block 32. The Y-axis direction movement means 36 includes a male thread rod 361 disposed in parallel to and between the pair of guide rails 322, and a driving source such as a pulse motor 362 for driving the male thread rod 361 to rotate. The male thread rod 361 is supported at one end thereof for rotation on a bearing block 363 fixed to an upper face of the first sliding block 32 and is connected at the other end thereof for motion transmission to an output power shaft of the pulse motor 362. It is to be noted that the male thread rod 361 is screwed in a female thread through-hole formed in a female thread block not depicted provided in a projecting manner on a lower face of a central portion of the second sliding block 33. Accordingly, if the male thread rod 361 is driven to rotate forwardly and reversely by the pulse motor 362, then the second sliding block 33 is moved in the Y-axis direction along the guide rails 322.

The first sliding block 32 and the second sliding block 33 include X-axis direction position detection means not depicted for detecting an X-axis direction position and Y-axis direction position detection means not depicted for detecting a Y-axis direction position, respectively. The first sliding block 32 and the second sliding block 33 can send driving signals to the driving sources therefor in response to the positions of the first and second sliding blocks 32 and 33 detected by control means hereinafter described to control the holding table 34 to a desired position.

The laser beam irradiation unit 4 includes a supporting member 41 disposed on the stationary base 2, a casing 42 supported on the supporting member 41 and extending substantially horizontally, laser beam irradiation means 5 disposed on the casing 42, and image pickup means 6 disposed at a front end portion of the casing 42 for detecting a processing region to be processed by laser processing. It is to be noted that the image pickup means 6 includes illumination means for illuminating the workpiece, an optical system for capturing the region illuminated by the illumination means, an image pickup element (charge-coupled device (CCD)) for picking up an image captured by the optical system and so forth and sends a picked up image signal to the control means hereinafter described.

The laser beam irradiation means 5 includes a condenser 51 which condenses a laser beam oscillated from pulse laser beam oscillation means accommodated in the casing 42 and irradiates the condensed laser beam upon the workpiece held on the holding table 34. Though not depicted, the pulse laser beam oscillation means in the casing 42 is configured from output adjustment means for a pulse laser beam, a pulse laser beam oscillator, repetition frequency setting means provided for the pulse laser beam oscillator and so forth and is controlled such that the focus point position of the pulse laser beam can be adjusted in a direction (Z-axis direction) perpendicular to the holding face which is an upper face of the holding table 34.

Further, the laser processing apparatus 1 includes wafer peeling means 8 disposed on the stationary base 2 and located in the proximity of a termination portion of the guide rails 31 (bearing block 353 side on which the male thread rod 351 is supported). The wafer peeling means 8 includes a peeling unit case 81, a peeling unit arm 82 partly accommodated in the peeling unit case 81 and supported for movement in the Z-axis direction (vertical direction) indicated by an arrow mark Z, a peeling pulse motor 83 disposed at a tip end portion of the peeling unit arm 82, and wafer absorption means 84 supported at a lower portion of the peeling pulse motor 83 so as to be rotated by the peeling pulse motor 83 and having a plurality of suction holes provided on a lower face thereof such that they can suck by suction means. In the wafer absorption means 84, ultrasonic vibration application means for applying ultrasonic vibrations to the absorption face is built. In the peeling unit case 81, Z-axis direction movement means for controlling the peeling unit arm 82 to move in the Z-axis direction is provided, and in the Z-axis direction movement means, a male thread rod not depicted which supports the peeling unit arm 82, a bearing block which supports the male thread rod and a pulse motor for driving the male thread rod to rotate forwardly and reversely. The peeling unit case 81 includes Z-axis direction position detection means not depicted for detecting the position of the peeling unit arm 82 in the Z-axis direction, and a position signal of the Z-axis direction position detection means is sent to control means hereinafter described.

The laser processing apparatus 1 includes control means. The control means is configured from a computer and includes a central processing unit for performing an arithmetic operation process in accordance with a control program, a read-only memory (ROM) in which the control program is stored, a readable and writable random access memory (RAM) for storing a result of an arithmetic operation and so forth, and input and output interfaces. To the input interface of the control means, detection signals from the X-axis direction position detection means, Y-axis direction position detection means, Z-axis direction position detection means, image pickup means 6 and so forth are inputted. From the output interface, control signals are outputted to the X-axis direction movement means 35, Y-axis direction movement means 36, Z-axis direction movement means in the peeling unit case 81, focus point position controlling means for a pulse laser beam, output controlling means for a pulse laser beam, peeling pulse motor 83 and so forth.

A production method of a lithium tantalate wafer according to the present invention carried out using the laser processing apparatus 1 configured in such a manner as described above is described below. FIG. 2 illustrates a state in which the lithium tantalate ingot 7 as a workpiece to be processed by the production method for a wafer in the embodiment of the present invention is placed on the holding table 34.

Figure 3:
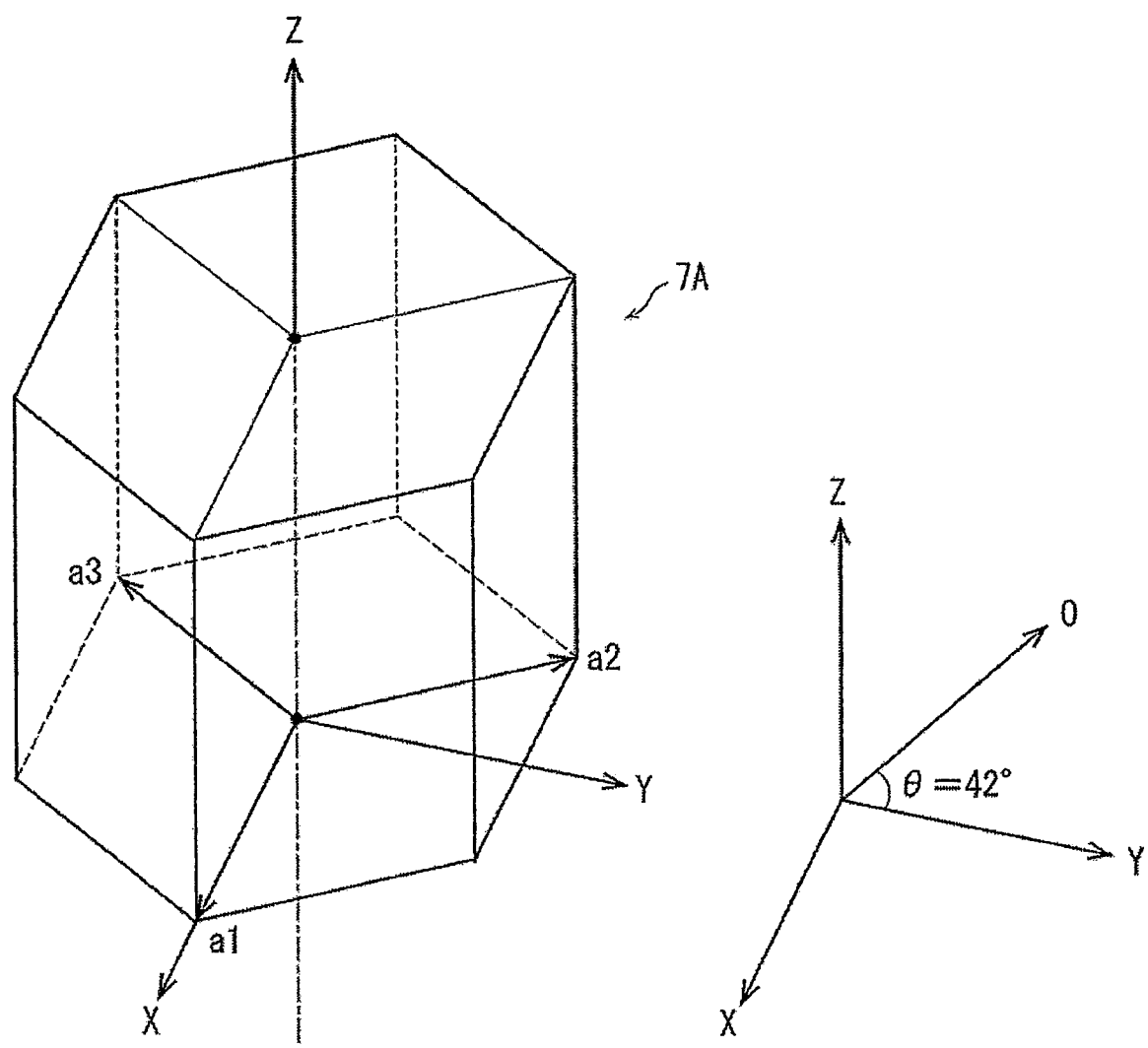
FIG. 3 is a schematic view depicting one crystal structure of lithium tantalate which forms a lithium tantalate ingot.

The lithium tantalate ingot 7 which is a workpiece depicted in FIG. 2 has a substantially circular shape, and a linear orientation flat 71 indicative of the crystal orientation is formed at part of a circumferential edge of the lithium tantalate ingot 7. The crystal of lithium tantalate indicates a trigonal ilmenite structure, and one crystal structure of lithium tantalate which forms the ingot, namely, a unit cell 7A, can be represented schematically in a hexagonal column shape as depicted in FIG. 3. The lithium tantalate ingot 7 which is a workpiece in the present embodiment is a 42-degree rotation Y cut single crystal ingot which has an end face extending perpendicularly with respect to the center axis O set with a rotational angle of $\theta=42$ degrees with respect to the Y axis orthogonal to the crystal axis (indicated by the Z axis in FIG. 3) of the crystal of the lithium tantalate ingot 7 and has the orientation flat 71 formed in parallel to the Y axis, and has a thickness of 257 μm. The lithium tantalate ingot used in the present specification and the claims is the 42-degree rotation Y cut single crystal ingot.

As depicted in FIG. 2, the lithium tantalate ingot 7 is fixed to the holding table 34. The fixation is performed by a bonding agent (for example, an epoxy resin) interposed between the holding table 34 and the lithium tantalate ingot 7, and the workpiece is fixed more firmly than that where suction means for fixing a workpiece which is used in a general laser processing apparatus is used (workpiece supporting step). It is to be noted that the surface of the lithium tantalate ingot 7 is ground by a grinding apparatus not depicted to such a degree that it does not prevent incidence of a laser beam for which a wavelength having transparency hereinafter described is used.

(Modified Layer Formation Step)

After the workpiece supporting step described above is carried out, the holding table 34 which holds the lithium tantalate ingot 7 thereon is positioned just below the image pickup means 6 by the X-axis direction movement means 35 and the Y-axis direction movement means 36. After the holding table 34 is positioned just below the image pickup means 6, the image pickup means 6 and the control means described hereinabove execute an alignment step of detecting a region of the lithium tantalate ingot 7 for which laser processing is to be executed and the height of the surface of the lithium tantalate ingot 7 placed on the holding table 34.

Figure 4A:
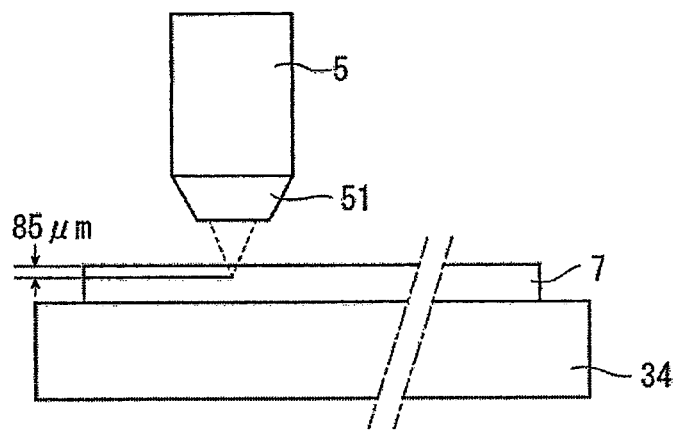
FIG. 4A is a schematic side elevational view illustrating a state in which a pulse laser beam is irradiated upon a lithium tantalate ingot held on the holding table.
Figure 4B:
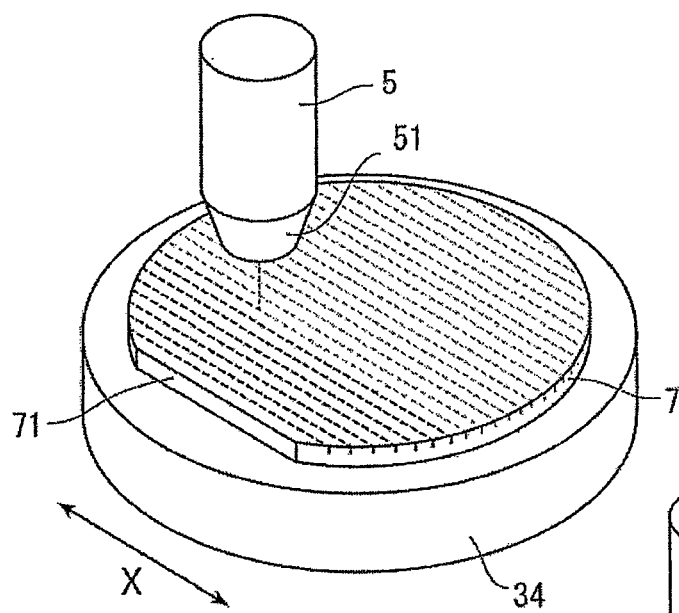
FIG. 4B is a perspective view illustrating another state in which a pulse laser beam is irradiated in parallel to an orientation flat on the lithium tantalate ingot held on the holding table.
Figure 4C:
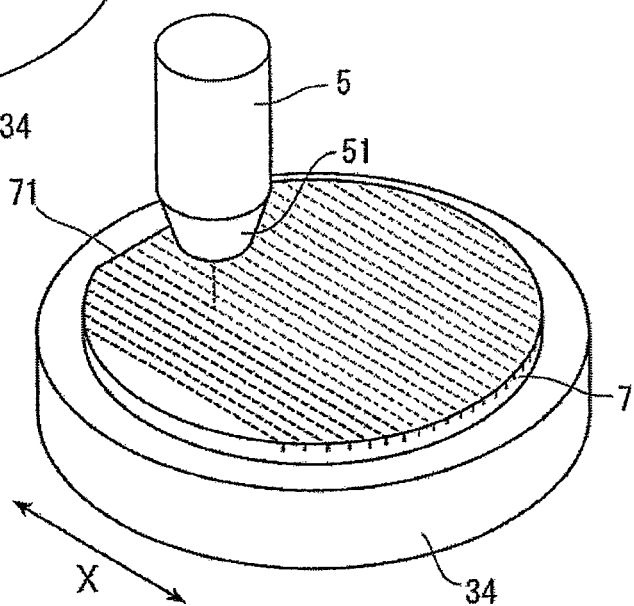
FIG. 4C is a perspective view illustrating a further state in which a pulse laser beam is irradiated orthogonally to the orientation flat on the lithium tantalate ingot held on the holding table.

After the alignment step is executed, the X-axis direction movement means 35 and the Y-axis direction movement means 36 are rendered operative to position the lithium tantalate ingot 7 at a point at which the laser processing is to be started and adjusts the focus point of the pulse laser beam to a position on the inner side by a predetermined distance (for example, 85 μm) from the surface of the lithium tantalate ingot 7 fixed to the holding table 34 by focus point position adjustment means not depicted on the basis of the surface height position of the lithium tantalate ingot 7 detected by the alignment step. Then, pulse laser beam irradiation means is rendered operative to start irradiation of a pulse laser beam having transparency to lithium tantalate. As depicted in FIGS. 4A to 4C, irradiation of the pulse laser beam is started and the X-axis direction movement means 35 is rendered operative to relatively move the holding table 34 in an arrow mark direction of the X axis. It is to be noted that, while, in the present embodiment, the holding table 34 is moved with respect to the laser beam irradiation means 5, the laser beam irradiation means 5 may otherwise be moved with respect to the holding table 34.

Processing conditions by the pulse laser beam are set, for example, in the following manner.

(Workpiece)
Ingot: $LiTaO_3$ 42-degree rotation Y cut
Thickness: 257 μm
Produced wafer thickness: 85 μm
(Laser Processing Conditions)
Wavelength: 1064 nm
Average output power: 0.55 W
Repetition frequency: 60 kHz
Pulse width: 3 ns
Spot diameter: 10.0 μm
Feed speed: 120 mm/second
Index amount: 50 to 70 μm
Path number: 1
Overlap ratio: 80%

Further, details of the modified layer formation step of the present invention are described. If irradiation of a pulse laser beam is started along a processing line by a pulse laser beam set in advance in the control means, then an initial modified layer is formed at and in the proximity of a focus point of the first pulse laser beam. In this state, the holding table 34 is moved at the predetermined processing feed speed by the X-axis direction movement means 35, and a next pulse laser beam is irradiated by the repetition frequency set in advance.

Since the next pulse laser beam irradiated here is irradiated such that it overlaps with the initial modified layer formed initially with an overlap ratio set in advance in the X-axis direction, the pulse laser beam irradiated next is absorbed by the modified layer formed initially, and as a result, the modified layers are formed in linkage.

Then, if the irradiation of the pulse laser beam described above is executed for all of the planned processing lines depicted in FIG. 4B, then the modified layer which makes an interface along which the upper face side with respect to a predetermined distance from the surface is to be separated as a wafer of lithium tantalate is formed over the overall region at the predetermined distance from the surface in the inside of the lithium tantalate ingot 7.

(Wafer Peeling Step)

Figure 5:
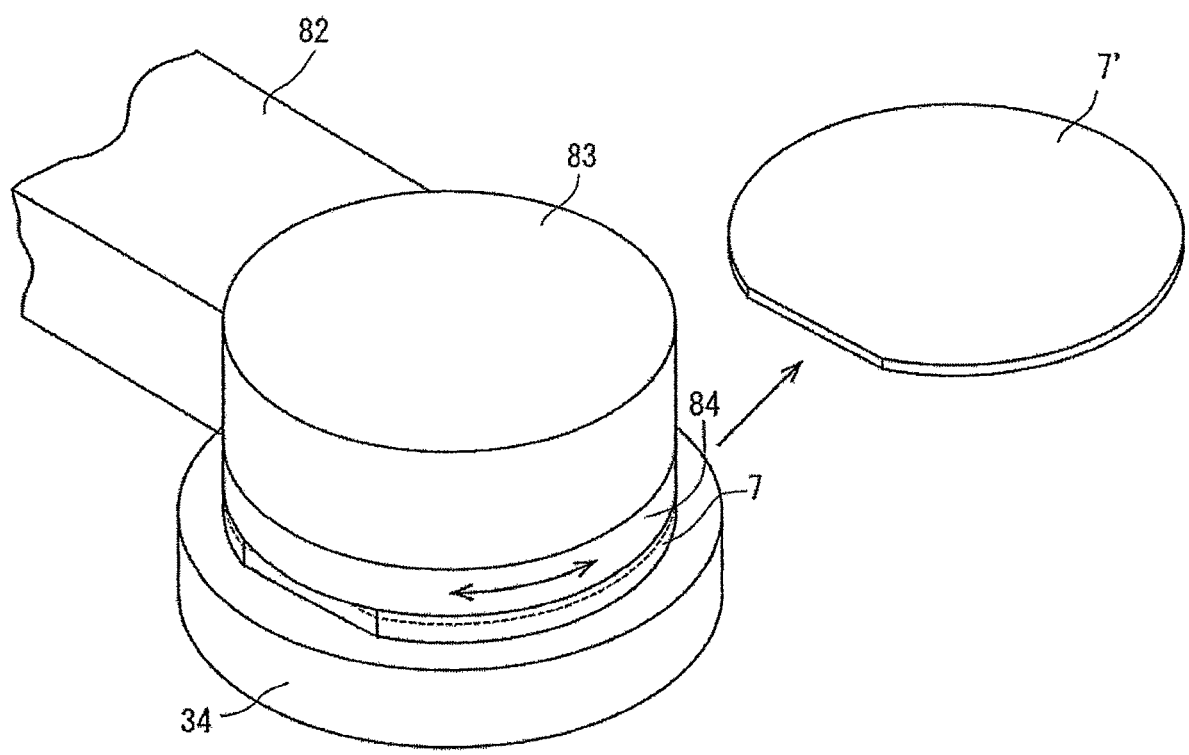
FIG. 5 is a perspective view illustrating a state in which a wafer is peeled off from a lithium tantalate ingot.

After the modified layer formation step comes to an end, the holding table 34 on which the lithium tantalate ingot 7 is placed is moved to the termination portion side on which the wafer peeling means 8 for peeling off the lithium tantalate wafer is disposed until it is positioned just below the wafer absorption means 84 through control of the X-axis direction movement means 35 and Y-axis direction movement means 36. The peeling unit arm 82 is moved down on the basis of the position from the surface of the lithium tantalate ingot 7 detected previously and inputted to the control means until the peeling unit arm 82 is closely contacted with the upper face of the lithium tantalate ingot 7, and the suction means not depicted is rendered operative to suck and fix the wafer absorption means 84 to the lithium tantalate ingot 7 (refer to FIG. 5). Then, in the state in which the wafer absorption means 84 and the lithium tantalate ingot 7 are fixed, ultrasonic vibrations are applied by the ultrasonic vibration application means not depicted and the peeling pulse motor 83 is rendered operative to drive the wafer absorption means 84 to rotate to provide twisting force to the lithium tantalate ingot 7 thereby to peel off the upper portion side of the lithium tantalate ingot 7 with respect to the boundary provided by the interface. One lithium tantalate wafer 7' can be obtained thereby.

After the lithium tantalate wafer 7' is obtained from the lithium tantalate ingot 7 described above, the lower face of the lithium tantalate wafer 7' is ground. When another lithium tantalate wafer 7' is to be obtained from the lithium tantalate ingot 7, the upper face of the lithium tantalate ingot 7 is ground by grinding means not depicted provided on the stationary base 2, and the steps described above are repetitively executed from the beginning for the new lithium tantalate ingot 7. By this, a plurality of lithium tantalate wafers 7' can be obtained without wasting the lithium tantalate as a workpiece.

Here, the inventor of the present invention has found out that, when processing for adjusting the focus point of the pulse laser beam to the inner side by the predetermined distance from the surface of the lithium tantalate ingot 7 fixed to the holding table 34 by the focus point position adjustment means not depicted and relatively moving the holding table 34 and the laser beam irradiation means 5 to form a modified layer to perform peeling off of a wafer is performed, a wafer is sometimes peeled off well and sometimes not peeled off well depending upon the angle defined by the direction in which feeding for processing is performed in order to continuously irradiate the laser beam upon the lithium tantalate ingot 7 and the orientation flat 71 of the lithium tantalate ingot 7 placed on the holding table 34, namely, that laser processing for the orientation flat 71 of the lithium tantalate ingot 7 has an angle dependence. The angle dependence is described below.

Figure 6A:
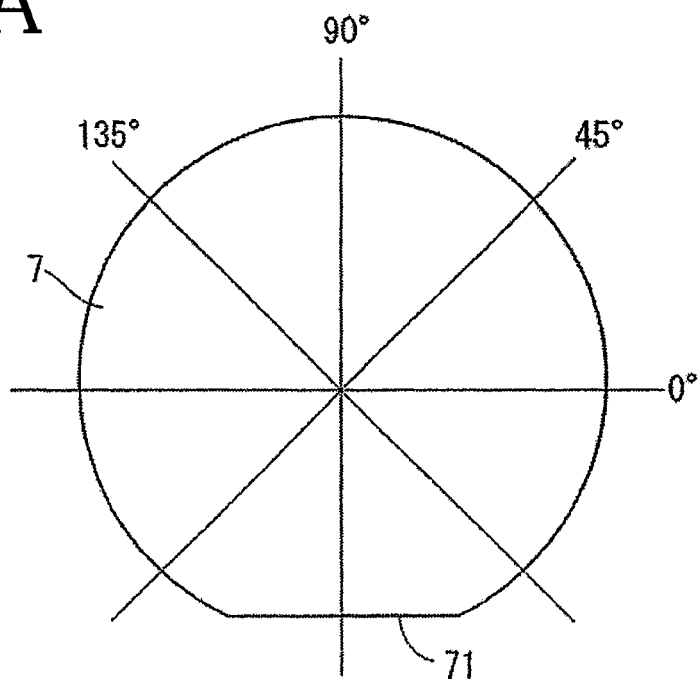
FIG. 6A is a plan view illustrating a processing feeding direction of a lithium tantalate ingot with respect to the orientation flat.

In the modified layer formation step described above, the direction for the processing feeding of the holding table 34 on which a pulse laser beam was to be irradiated was changed among four directions (refer to FIG. 6A) of 0 degree (parallel), 45 degrees, 90 degrees (right angle) and 135 degrees with reference to the orientation flat 71 of the lithium tantalate ingot 7 placed on the holding table 34. Then, the modified layer formation step was performed in the quite same processing conditions except the angle of the orientation flat 71, with respect to the processing feeding direction, of the lithium tantalate ingot 7 when the lithium tantalate ingot 7 was placed on the holding table 34, and then the peeling step was carried out.

Figure 6B:
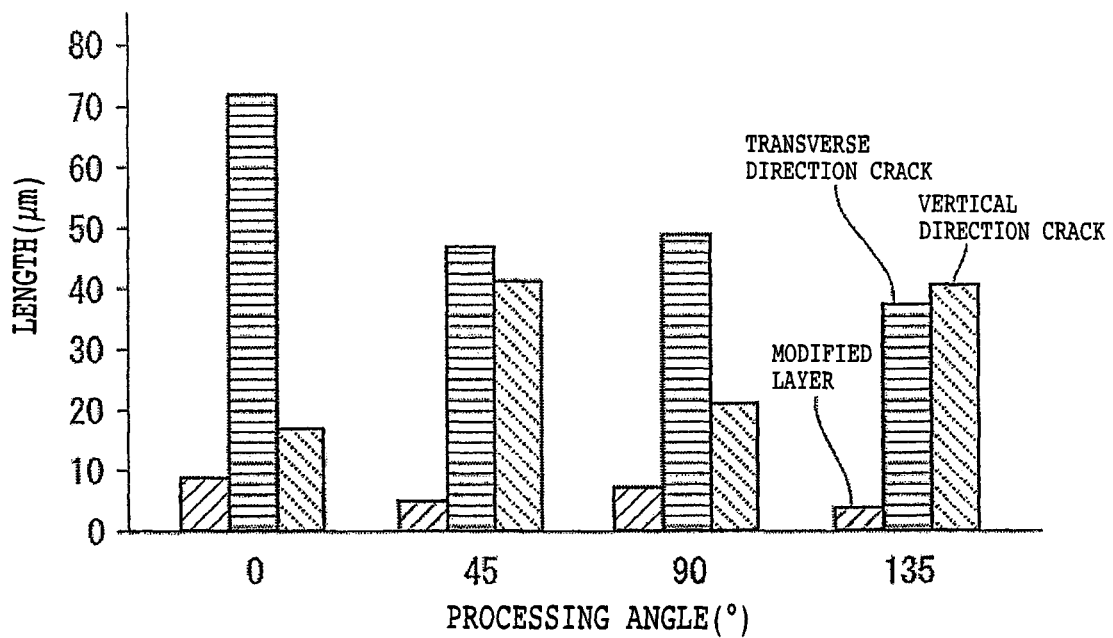
FIG. 6B is a graph illustrating a relationship between a processing feeding direction of a lithium tantalate ingot with respect to the orientation flat and the lengths of a modified layer, a transverse crack and a vertical crack.

Then, when wafers were produced in the processing conditions described above, it became clear that a characteristic difference was caused by the processing angle defined by the orientation flat 71 of the lithium tantalate ingot 7 placed on the holding table 34 and the processing feeding direction as illustrated in FIG. 6B. In particular, it was confirmed that, if the lithium tantalate ingot 7 is placed on the holding table 34 and the direction for the processing feeding when a pulse laser beam is to be irradiated is set so as to be 0 degree (parallel) with reference to the orientation flat 71 as depicted in FIG. 4B, then while a crack stretches with a length of 70 to 80 μm in a transverse direction from the laser irradiation position in laser processing, in a vertical (depthwise) direction, the crack stretches only within a range from 10 to 20 μm. This signifies that an interface along which peeling occurs is formed so as to extend in parallel to an end face of the ingot and peeling off can be performed well at the peeling step and that a wafer is formed in a state in which the surface roughness of the peeling face after the peeling off is good. Similarly, it was confirmed that, as depicted in FIG. 4C, also when laser processing was performed setting the direction for the processing feeding when a pulse laser beam is to be irradiated so as to be 90 degrees (right angle) with reference to the orientation flat 71, while a crack was generated with a length of approximately 50 μm in a transverse direction from the laser irradiate position while a crack was generated only by approximately 20 μm in the vertical (depthwise) direction, and also when laser processing was carried out setting the processing feeding direction so as to be 90 degrees (right angle) with reference to the orientation flat 71, an interface was formed so as to extend in parallel to an end face of the ingot and it was possible to perform peeling off well at the peeling step.

In contrast, when the direction for the processing feeding when a pulse laser beam is to be irradiated was set to 45 degrees or 135 degrees with reference to the orientation flat 71, while a crack stretched with a length of 35 to 45 μm in the transverse direction from a modified layer formed by laser processing, a crack was generated within a range of 35 to 45 μm also in the vertical (depthwise) direction. Consequently, it was not possible to form an interface parallel to an end face of the lithium tantalate ingot 7 well.

When considered on the light of the above, if the direction for the processing feeding when a pulse laser beam is to be irradiated is set to 0 degree or 90 degrees with reference to the orientation flat 71, then a crack is generated such that it stretches longer in the transverse direction (horizontal direction) than in the vertical (depthwise) direction by laser processing for forming a modified layer thereby to form an interface, and consequently, a wafer can be peeled off readily in parallel to an end face of the ingot. Since the crack stretched longer in the transverse direction than that where the direction is set to 45 degrees or 135 degrees, laser processing can be carried out increasing the index feeding (index) distance, and it is recognized that also it is possible to improve the processing efficiency.

Further, if the direction for the processing feeding when a pulse laser beam is irradiated is set to 0 degree or 90 degrees with reference to the orientation flat 71, since the crack generated in the vertical direction is short, the surface roughness of the peeling face of the wafer is good and also the grinding step after the processing can be ended in a short period of time. Further, also the amount of the ingot discarded at the wafer production step is reduced and also contribution to improvement of the processing efficiency is anticipated. It is to be noted that, as apparent from FIG. 6B, where the direction for the processing feeding when a pulse laser beam is irradiated is set to 0 degree with reference to the orientation flat 71, it is possible to allow a crack to be generated longer in the transverse direction than that where the direction is set to 90 degrees, and a crack in the vertical direction can be suppressed short. Therefore, that the direction is set to 0 degree is preferable in that a wafer of lithium tantalate can be peeled off readily and efficiently and the amount of the ingot which is discarded can be reduced further.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer production method for producing a wafer from a lithium tantalate ingot which is a 42-degree rotation Y cut ingot having an end face extending perpendicularly with respect to a center axis set with a rotational angle of 42 degrees with respect to a Y axis orthogonal to a crystal axis of a lithium tantalate and having an orientation flat formed in parallel to the Y axis, the method comprising:
   a modified layer formation step of irradiating a laser beam of a wavelength having transparency to lithium tantalate, with a focal point of the laser beam positioned at a depth corresponding to a thickness of a wafer to be produced, from the end face of the lithium tantalate ingot, to form a modified layer within the lithium tantalate ingot while the lithium tantalate ingot is fed for processing relative to the laser beam in a direction parallel or perpendicular to the orientation flat;
   applying ultrasonic vibrations to the lithium tantalate ingot; and
   a wafer production step of applying, after the modified layer formation step is carried out, a rotational external force to the lithium tantalate ingot to peel off a layer of material from the lithium tantalate ingot to produce a wafer, wherein said rotational external force rotates the lithium tantalate ingot about the center axis.

2. The wafer production method according to claim 1, further comprising a grinding step of grinding a peeling face of the produced wafer and a peeling face of the lithium tantalate ingot to flatten the peeling faces.

3. The wafer production method according to claim 1, further comprising a fixing step of fixing, prior to the modified layer formation step, the lithium tantalate ingot to a holding table.

4. The wafer production method according to claim 3, wherein said fixing step includes placing a bonding agent between the lithium tantalate ingot and the holding table.

5. The wafer production method according to claim 3, further comprising an adjusting step of adjusting the focal point of the laser beam to a position within the lithium tantalate ingot that is a predetermined distance from the surface of the lithium tantalate ingot fixed to the holding table.

6. The wafer production method according to claim 1, further comprising an alignment step of detecting a region of the lithium tantalate ingot to be irradiated by the laser beam and a height of a surface of the lithium tantalate ingot.

7. A wafer production method for producing a wafer from a lithium tantalate ingot which is a 42-degree rotation Y cut ingot having an end face extending perpendicularly with respect to a center axis set with a rotational angle of 42 degrees with respect to a Y axis orthogonal to a crystal axis of a lithium tantalate and having an orientation flat formed in parallel to the Y axis, the method comprising:
   a modified layer formation step of irradiating a laser beam of a wavelength having transparency to lithium tantalate, with a focal point of the laser beam positioned at a depth corresponding to a thickness of a wafer to be produced, from the end face of the lithium tantalate ingot, to form a modified layer within the lithium tantalate ingot while the lithium tantalate ingot is fed for processing relative to the laser beam in a direction parallel or perpendicular to the orientation flat; and
   a wafer production step of moving, after the modified layer formation step is carried out, a peeling unit arm into contact with the lithium tantalate ingot and applying a rotational external force to the lithium tantalate ingot using the peeling unit arm to peel off a layer of material from the lithium tantalate ingot to produce a wafer, wherein said peeling unit arm rotates the lithium tantalate ingot about the center axis.

8. The wafer production method according to claim 7, further comprising a grinding step of grinding a peeling face of the produced wafer and a peeling face of the lithium tantalate ingot to flatten the peeling faces.

9. The wafer production method according to claim 7, further comprising a fixing step of fixing, prior to the modified layer formation step, the lithium tantalate ingot to a holding table.

10. The wafer production method according to claim 9, wherein said fixing step includes placing a bonding agent between the lithium tantalate ingot and the holding table.

11. The wafer production method according to claim 9, further comprising an adjusting step of adjusting the focal point of the laser beam to a position within the lithium tantalate ingot that is a predetermined distance from the surface of the lithium tantalate ingot fixed to the holding table.

12. The wafer production method according to claim 7, further comprising an alignment step of detecting a region of the lithium tantalate ingot to be irradiated by the laser beam and a height of a surface of the lithium tantalate ingot.

13. The wafer production method according to claim 7, further comprising applying ultrasonic vibrations to the lithium tantalate ingot.

* * * * *